United States Patent
Eberler et al.

(10) Patent No.: US 6,927,573 B2
(45) Date of Patent: Aug. 9, 2005

(54) METHOD TO CORRECT THE B1 FIELD IN MR MEASUREMENTS AND MR APPARATUS FOR IMPLEMENTING THE METHOD

(75) Inventors: Ludwig Eberler, Postbauer-Heng (DE); Markus Vester, Nuremberg (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 10/720,720

(22) Filed: Nov. 24, 2003

(65) Prior Publication Data

US 2004/0150401 A1 Aug. 5, 2004

(30) Foreign Application Priority Data

Nov. 22, 2002 (DE) ......................................... 102 54 660

(51) Int. Cl.[7] ................................................. G01V 3/00
(52) U.S. Cl. ...................................... 324/309; 324/318
(58) Field of Search ............................... 324/309, 307, 324/300, 318, 322; 600/410

(56) References Cited

U.S. PATENT DOCUMENTS

| 2,750,555 | A | * | 6/1956 | Kather et al. ............... 323/227 |
| 3,460,042 | A | * | 8/1969 | Harner ................... 340/870.28 |
| 4,689,563 | A | * | 8/1987 | Bottomley et al. .......... 324/309 |
| 5,138,261 | A | | 8/1992 | Ratzel ......................... 324/318 |
| 5,261,405 | A | * | 11/1993 | Fossel ......................... 600/410 |
| 6,334,069 | B1 | * | 12/2001 | George et al. .................. 607/2 |
| 6,433,546 | B1 | | 8/2002 | Kroeckel et al. ............ 324/309 |

\* cited by examiner

Primary Examiner—Brij B. Shrivastav
(74) Attorney, Agent, or Firm—Schiff Hardin, LLP

(57) ABSTRACT

In a method and magnetic resonance examination apparatus wherein the field strength of radio-frequency pulses emitted by an antenna of the magnetic apparatus, the current flowing in the antenna upon the emission of the radio-frequency pulses is regulated by a predetermined nominal value by variation of a power fed into the antenna.

13 Claims, 3 Drawing Sheets

METHOD TO CORRECT THE B1 FIELD IN MR MEASUREMENTS AND MR APPARATUS FOR IMPLEMENTING THE METHOD

BACKGROUND OF THE INVENTION

1. Field of the Invention

The present invention concerns a method to correct the field strength of radio-frequency pulses, which in a magnetic resonance MR examination are emitted by an antenna of a magnetic resonance examination apparatus.

2. Description of the Prior Art

Magnetic resonance tomography is an increasingly employed technique to acquire images of the inside of the body of a living examination subject. In order to acquire an image with this modality, the body or a body part of the examination subject must first be exposed to as homogenous a static basic magnetic field as possible, which is generated by a basic field magnet of the magnetic resonance measurement device. During the data acquisition for the magnetic resonance Images, rapidly switched gradient fields for spatial coding, which are generated by gradient coils, are superimposed on this basic magnetic field. Radio-frequency pulses of a defined field strength are then emitted into the examination subject with a radio-frequency antenna. The magnetic flux density of these radio-frequency pulses is typically designated as $B_1$, the pulsed radio-frequency field is generally also called a $B_1$ field for short. By means of the radio-frequency pulses, in the examination subject magnetic resonance signals are excited which are acquired by a radio-frequency reception antenna. The reception antenna can either be the same antenna with which the radio-frequency pulses are emitted or a separate reception antenna. The magnetic resonance images of the examination subject are then generated on the basis of the received magnetic resonance signals. A small physical volume, known as a "voxel," is associated with each image point in the magnetic resonance image. Each brightness or intensity value of the image points is linked with the signal amplitude of the magnetic resonance signal received from the voxel. The strength of the magnetic resonance signal is also dependent on, among other things, the strength of the emitted B1 field. Oscillations in the field strength of the excited B1 field thus lead to unintentional changes in the received magnetic resonance signal that can falsify the measurement result.

Typically, multiple transmission antennas are employed in magnetic resonance imaging as resonant antennas. Such antennas are differently energized by different loads, which, given constant feed power, leads to radio-frequency field strengths of different amplitudes. The load affecting the antenna is substantially dependent on, among other thing, the position of the examination subject in relationship to the antenna. Consequently, a new positioning of the patient between two magnetic resonance measurements within an examination, or an accidental movement of the patient, inevitably lead to a change of the antenna load and thus, given the same feed power, to a change of the B1 field. For this reason, a new adjustment of the transmitting power is typically implemented with each new positioning of a patient, in order to again set the B1 field to the correct value. Such an adjustment measurement is relatively complicated. As a rule, for this purpose the transmitting power is modified until, given a predetermined duration of the transmission pulse, by the influence of a radio-frequency pulse a specific, precisely measurable flip angle is set between the nuclear magnetization and the homogeneous magnetic basic field. Given the known flip angle and known pulse duration, the actual $B_1$ field that exists given the appertaining transmitting power is determined. As a rule, the adjustment (calibration) ensues at a flip angle a of 180°, meaning at a location in which the nuclear magnetization is opposite to the static magnetic field, since in this case no magnetic field component exists transverse to the magnetic basic field. This transverse magnetization can be easily directly verified by the signal (free induction decay, FID) induced in the radio-frequency coil after the end of the exciting radio-frequency pulse. Therefore, to adjust the B1 field, only the transmitting power must be varied, until the received FID signal is equal to zero.

A problem with this method is that, given multiple examinations, in particular given whole-body scans (such as, for example, in examinations in which blood vessels should be shown from the center of the body to the legs, using contrast), a faster measurement process is imperative. For such measurements to be implemented quickly, complicated transmitting power adjustments in the case of a new positioning of the patient can not be implemented for reasons of time. The adjustments are therefore often foregone at the cost of image quality.

SUMMARY OF THE INVENTION

It is an object of the present invention to provide a correction method and a magnetic resonance apparatus with which the field strength of the radio-frequency pulses, meaning the $B_1$ field, can be held substantially constant during an examination, even without the aforementioned adjustment measurements.

This object is achieved in a method and wherein the current flowing in the antenna for the transmission of a radio-frequency pulse is regulated by variation, by a predetermined nominal value, of the electrical power fed into the antenna. Use is made of the fact that the change of the load on the antenna effects a corresponding change of the loss resistance (equivalent resistance) of the antenna. This would lead to a corresponding change of the current, without a correction of the feed power. In contrast, the $B_1$ field is always proportional to the current, independent of the load. This means, to a very good approximation, that a constant current in the transmitting antenna is synonymous with a constant $B_1$ field. By the regulation of the current by a predetermined nominal value by a corresponding correction of the feed power, a correspondingly constant $B_1$ field is emitted is achieved in a simple manner.

Given a table movement during the examination, the necessary feed power therefore need not be corrected by means of a corresponding magnetic resonance procedure, as was previously typical. Instead, a dynamic correction directly ensues by regulation of the current. This correction proceeds not in an independent sequence, but parallel to the running data acquisition without extending the measurement time. For a given patient position, a basic adjustment of the feed power merely must be implemented before the beginning of the actual data acquisition for imaging. In addition to the adjustment method described above, every other suitable method can be used.

In a simplified embodiment of the inventive method, the current is held at a constant value during the entire magnetic resonance examination. This means the current that was set in the basic adjustment of the feed power before the beginning of the actual examination is used as a nominal value. Such a regulation of the current by a constant value can be implemented relatively simply.

Given high frequencies of, for example, over 50 MHz, the field strength inside of the body is additionally independently modified by eddy currents and dielectric displacement currents. These effects can not be corrected by a simple regulation of the antenna current by a constant value. However, such currents ensuing in the examination subject during the measurement are dependent on the physical volume in the field in a manner similar to the antenna load itself. In a preferred embodiment, the current changes in the antenna that ensue during the magnetic resonance examination are therefore under- or overcompensated in the regulation by a specific degree, in order to at least partially compensate during the examination, the influence of the currents within the examination subject on the field strength of the radio-frequency pulses. This is possible by varying the nominal value dependent on the currently determined actual current value, which is a measure for the load of the antenna. For this, for example, the nominal value can be raised or lowered by a specific empirically determined factor, dependent on the currently determined actual value. To determine such compensation factors, before the examination a number of test series can be implemented with different examination subjects or test persons. After the compensation factors are established once, a relatively good compensation of the additional currents ensuing in the examination subject is possible in a relatively simple manner with the inventive method.

In a further exemplary embodiment, the regulation of the current ensues phase-sensitively, meaning not only the amplitude is regulated, but also the phase of the current. In this manner, changes of the resonance frequency of the antenna caused by the patient, for example, by accidental approach of body parts to the antenna, can be compensated. Since phase changes in the $B_1$ field during a measurement would falsify the results, such a phase-sensitive regulation of the current or, respectively, $B_1$ field is sensible, in particular in a functional magnetic resonance imaging (MRI) with which information about the activities in human and animal organs is be acquired, and consequently in which in particular changes of the received magnetic resonance signal must be evaluated.

To regulate the current by a nominal value, it is merely necessary to determine a proportionally appropriate restorative quantity and to supply this to a regulation device that appropriately varies the power fed to the antenna. There are various possibilities to determine an appropriate restorative quantity.

In a preferred embodiment, a number of field probes are used that are arranged in proximity to the antenna and, on the output side, are connected with the regulation device. In these field probes, a current is induced, dependent on the field emitted by the antenna, which is proportional to the field and thus to the current in the antenna. This voltages induced in the field proves are transmitted to the regulation device as output signals. "In proximity to the antenna", means that the field probes are located in the transmission area of the antenna, i.e. near enough to the antenna so that a sufficiently high voltage signal is induced in the probes. The field probes can be located outsides or inside of the volume encompassed by the antenna.

In principle, a single field probe can be used to determine the restorative quantity. However, at least two field probes, appropriately arranged at the antenna at a specific angle to one another, are preferably used in order to determine both linear polarized components of a circular polarized field emitted by the antenna. The field probes preferably are connected by a phase shifter with the regulation device that superimposes the output signals of the field probes, forming a mutual restorative signal. The phase shifting of the output signal of the field probes must be chosen dependent on the angle arrangements of the field probes to one another. Given use of two field probes which are disposed at a 90° angle to one another, this means the output signals must be correspondingly merged with a 90° phase shifter, and, for example given a use of three probes which are each disposed at an angle of 120° to one another, a 120° phase shifter would have to be used, and so forth.

The use of at least two probes for both linear polarized components is sensible given circular polarized transmitting antennas, in order to be able to determine the variation in the circularity and the influence connected thereto on the necessary transmission amplitude, Since the body geometry of a person to be examined is differentiated most strongly In the horizontal and vertical axes, and thus these directions represent different loads, the field probes are preferably arranged at an angle of 0°, 90°, 180° and/or 270° with regard to a horizontal slice plane through the person to be examined. The field probes preferably are mounted outside of the antenna, in order to prevent the probe feed lines from intersecting with the antenna structures.

In a further exemplary embodiment, the restorative signal for the current regulation is determined using directional couplers arranged in the antenna supply lines. Given an antenna with only one supply line, only one directional coupler is necessary. Given an antenna with a number of supply lines and a corresponding number of directional coupler, the directional couplers are, on the output side, respectively connected again with appropriate phase shifters, such that the decoupled signals of the directional coupler are appropriately superimposed with a phase-shift relative to one another. With such a directional coupler connected in the transmission path, the in-fed and the reflected voltages at the antenna are detected. The relationships at the feed point of the antenna thus are indirectly detected by a transformation on the power. Since the inductance, dependent solely on the antenna geometry, remains constant during the examination, the voltage induced in the directional coupler is proportional to the current in the antenna, and consequently it can be obtained directly from the induced voltage signal of the directional coupler on the currents in the antenna.

DESCRIPTION OF THE PREFERRED EMBODIMENTS

In all exemplary embodiments, it is assumed that the antenna 1 is a transmission antenna 1 of a type known as a "birdcage antenna", typically used in magnetic resonance examination devices. These antenna 1 is assembled so as to resemble a birdcage and has a cylindrical shape with two end rings 3 at the ends and longitudinal rods 2 proceeding in parallel between the end rings 3. Capacitive elements are connected in the end rings 3 between the rods 2. With such an antenna 1, relatively homogenous circular polarized $B_1$ fields proceeding transverse to the cylinder axis A of the antenna 1 can be generated.

During an examination, a patient P is positioned along the cylinder axis A of the antenna 1 in the internal chamber of the antenna 1. The position of the patient P along the cylinder axis A can be changed between two individual exposures, in order to examine different body regions of the patient P. For this, the patient P is typically located on an examination bed (not shown) arranged within a plane E that can be moved in the direction of the cylinder axis A. The load of the antenna 1 is automatically changed by the change of the position of the patient P, and thus the antenna 1 is differently energized.

If a constant power were to be fed into the antenna 1 via the input lines 12, 13, the current I flowing in the antenna 1, and thus the field strength (i.e. the magnetic flux density of the radio-frequency pulses that are emitted by the antenna 1), would also change with the variation of the loading. In order to prevent this, in the exemplary embodiments of the invention, the current I in the antenna 1 is regulated by variation of the transmitting power by a constant value.

Figure 1:
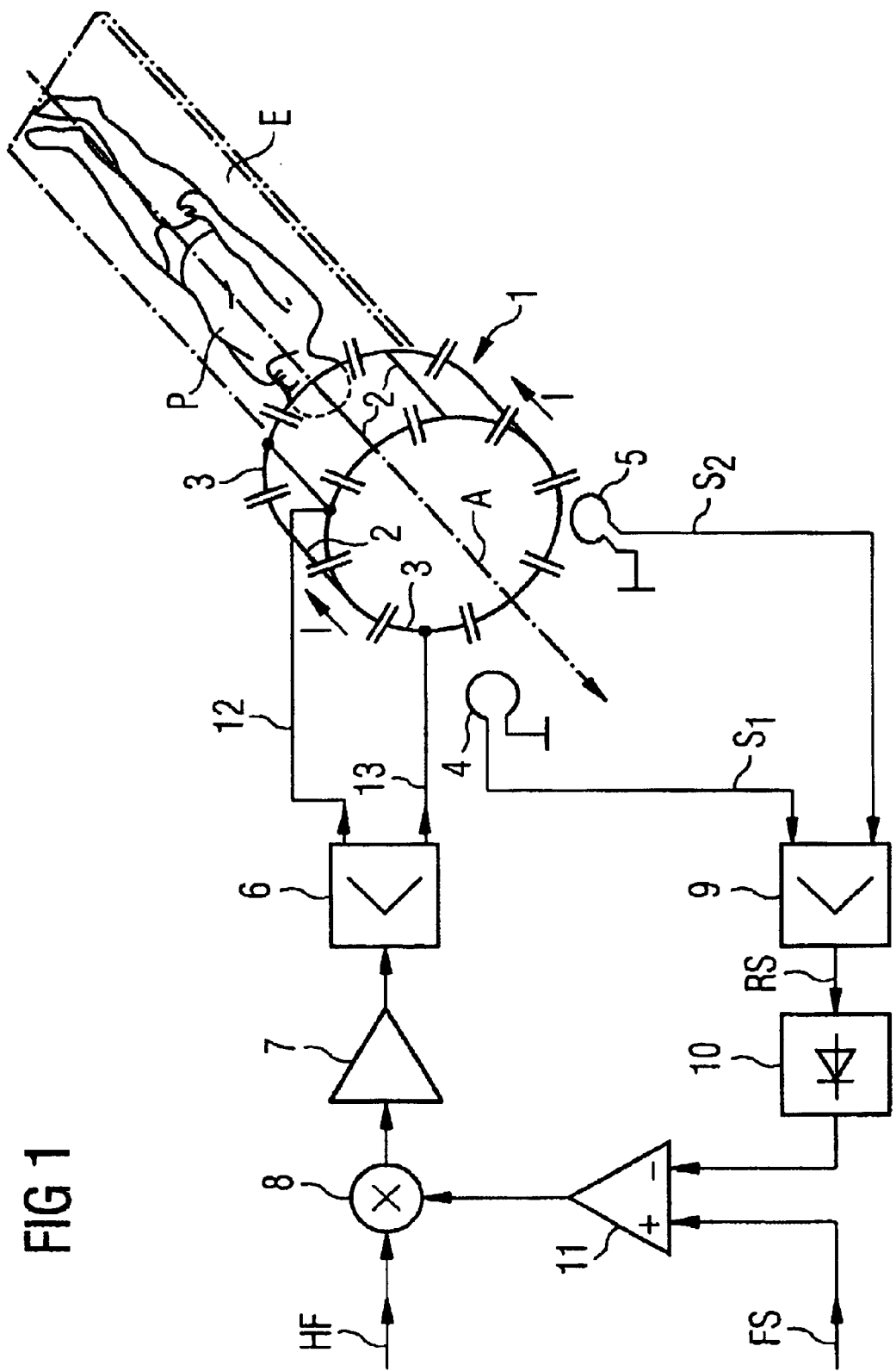
FIG. 1 is a basic block diagram of a circuit for supplying an antenna of an inventive magnetic resonance examination apparatus with radio-frequency pulses, with a regulation device according to a first exemplary embodiment.

For this, in the exemplary embodiment according to FIG. 1, a restorative signal RS is determined by means of two field probes (also called pickup probes) which is proportional to the current I flowing in the antenna 1. These field probes 4, 5 in this embodiment are mounted outside of the antenna 1 in proximity to the end rings 3. This has the advantage that the probe supply lines do not intersect the antenna structures. In principle, however, the field probes 4, 5 can also be arranged near the rods 2.

Upon emitting the radio-frequency pulses by the antenna 1, a voltage is induced in the probes 4, 5 which is proportional to the current I in the antenna 1. Both probes 4, 5 are arranged at 90° to one another at the (in FIG. 1) forward end ring 3 of the antenna, such that both output signals $S_1$, $S_2$ of both probes 4, 5, meaning the induced voltages, are respectively proportional to the linear polarized components of the overall circular polarized field emitted by the antenna 1. Both output signals $S_1$, $S_2$ are superimposed on one another by means of a 90° phase shifter and thus form a common restorative signal RS.

This restorative signal RS is converted (transformed) in a demodulator 10 into a direct voltage signal. The direct voltage signal is then compared within a comparator 11 with a reference signal or reference value FS which finally forms a nominal value, corresponding to the restorative signal RS, for the current I to be adjusted. A regulation difference is then present at the output of the comparator 11, which is linked via an amplitude modulator 8 with the incoming radio-frequency control signal HF. The radio-frequency control signal HF is influenced in the appropriate direction, such that the power fed into the antenna 1 is changed such that the current I remains constant in the antenna 1. The radio-frequency control signal HF output from the amplitude modulator 8 is amplified before the antenna 1 in a typical manner with an radio-frequency power amplifier 7 and split via a 90° coupler (90° hybrid) 6, such that two radio-frequency signals, phase-shifted 90° relative to one another, are appropriately fed into the antenna 1 via the antenna supply lines 12, 13, in order to generate overall a circular polarized $B_1$ field.

The modulation of the output signals $S_1$, $S_2$ or the common restorative signal RS coming from the probes 4, 5, the comparison with the reference signal FS, and the correction of the transmission signal can ensue with analog and/or digital means.

Figure 2:
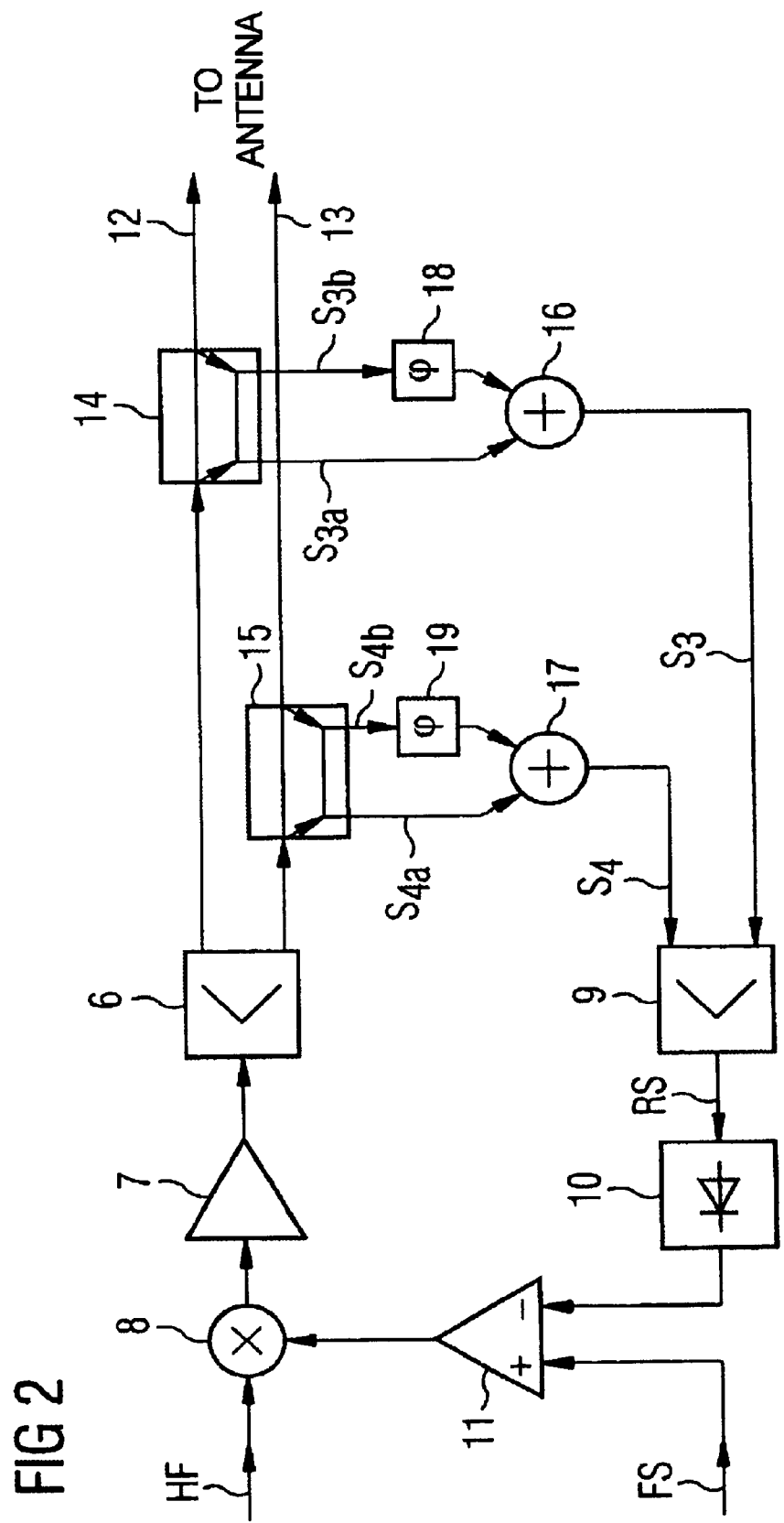
FIG. 2 is a basic block diagram of a circuit for supplying an antenna of an inventive magnetic resonance examination apparatus with radio-frequency pulses, with a regulation device according to a second exemplary embodiment.

FIG. 2 shows modified exemplary embodiment of the circuit according to FIG. 1. The representation of the antenna 1 and the examination subject P have been foregone here. The antenna 1 can be fashioned identical to the exemplary embodiment according to FIG. 1.

In contrast to the exemplary embodiment according to FIG. 1, however, here two field probes 4, 5 are used to determine a restorative signal. Instead, directional couplers 14, 15 are connected in the antenna supply lines 12, 13 which respectively decouple a signal $S_{3a}$, $S_{3b}$, $S_{4a}$, $S_{4b}$ from the wave propagating forward and back on the appertaining antenna supply line 12, 13. The decoupling signals $S_{3a}$, $S_{3b}$, $S_{4a}$, $S_{4b}$ of the directional couplers 14, 15 corresponding to the wave running forward and back are respectively added in adders 16, 17. Before this the signals $S_{3a}$, $S_{4a}$ corresponding to the back-propagating wave are phase-shifted in phase shifters 18, 19 by an angle that directly compensates the phase shifting that the signal experienced from the directional coupler to the antenna and back. Both the transmit times on the connection cables and the phase shifts in the antenna adaptation network contribute to this. Signals $S_3$, $S_4$ then exist at the output of the respective adders 16, 17 that are proportional to the voltage at the associated in-feed point of the appertaining supply line 12, 14 at the antenna 1. Both signals $S_3$, $S_4$ are then coupled with one another via a 90° phase shifter, and thus form a restorative signal RS' to regulate the current I of the antenna 1 at a constant value. The further processing of this restorative signal RS' ensues analogously to the exemplary embodiment in FIG. 1. Likewise, the influence of the radio-frequency control signal HF ensues in the same manner, dependent on the restorative signal RS'.

Figure 3:
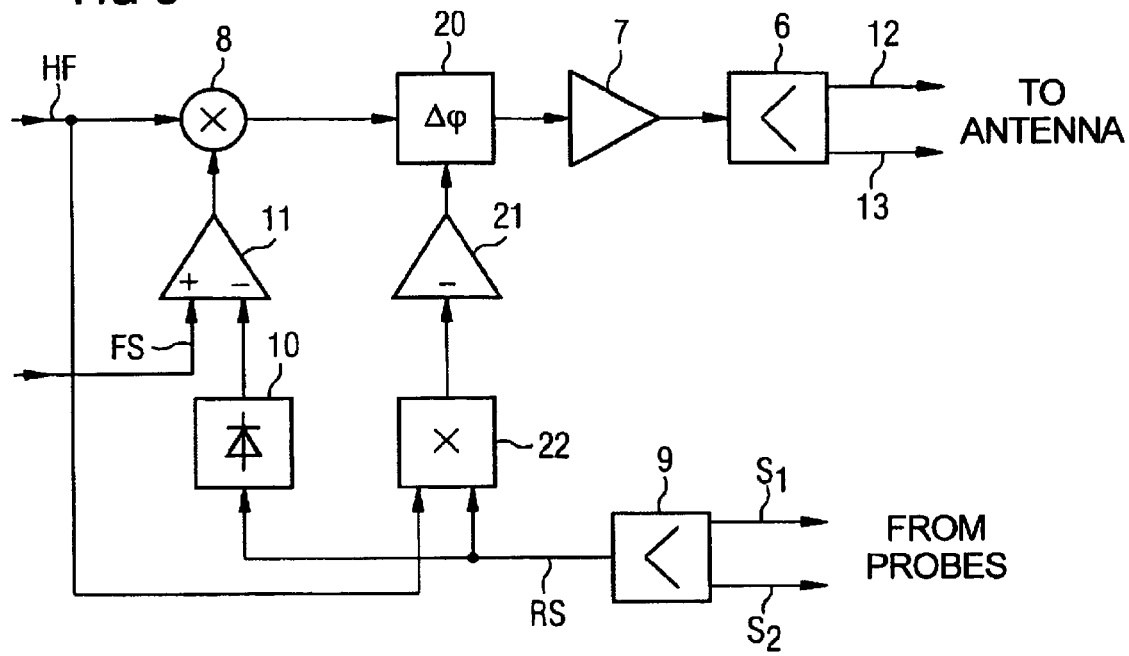
FIG. 3 is a basic block diagram of a circuit for supplying an antenna of an inventive magnetic resonance examination apparatus with radio-frequency pulses, with a regulation device according to a third exemplary embodiment.

FIG. 3 shows a variant in which not only the amplitude, but also the phase of the current I is evaluated and considered in the regulation. With such a regulation, changes of the antenna resonance frequency effected by the patient can also be compensated. Such antenna resonance frequency changes can ensue, for example, by the patient positioned within the antenna 1 moving, for example, a hand moving closer to the antenna 1.

In the exemplary embodiment according to FIG. 3, it is assumed that the restorative signal RS is determined by probes 4, 5 arranged at the antenna 1, as in the exemplary embodiment according to FIG. 1. The output signals $S_1$, $S_2$ from the probes 4, 5 are first superimposed on one another via a 90° phase shifter 9 to form a common restorative signal RS.

This restorative signal RS already contains the information as to the amplitude and the phase of the current I. The restorative signal RS is therefore split and on is supplied to a demodulator 10, as in the exemplary embodiment according to FIG. 1, such that from this a direct voltage signal is generated that is compared with the reference value FS in the comparator 11. In a typical manner, the output signal of the comparator 11 therefore is used in order to influence the radio-frequency control signal HF in a suitable manner by an amplitude modulator 8.

Additionally, the restorative signal RS is given to an input of a phase comparator 22 in which the restorative signal RS is compared with the phase of the arriving radio-frequency control signal HF. The difference signal is then supplied to the input of a regulator 21 that has a phase shifter 20 that is arranged between the amplitude modulator 8 and the power intensifier 7 in the supply line for the resource file control signal HF to the antenna 1. In this phase shifter 20, the difference signal is then modified corresponding to the phase of the input radio-frequency control signal HF in the correct manner, in order to compensate the change of the antenna resonance frequency and the phase change in the antenna 1 as a consequence thereof.

Figure 4:
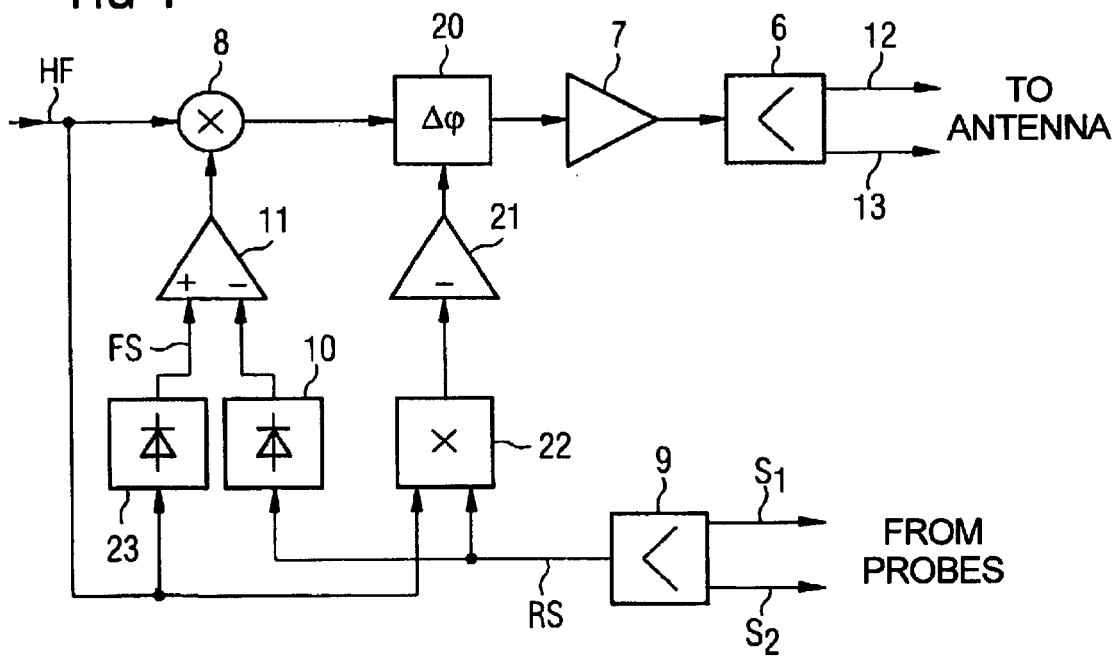
FIG. 4 is a basic block diagram of a circuit for supplying an antenna of an inventive magnetic resonance examination apparatus with radio-frequency pulses, with a regulation device according to a fourth exemplary embodiment.

FIG. 4 shows a further exemplary embodiment that is arranged substantially as the exemplary embodiment according to FIG. 3. The signal difference between the two exemplary embodiments is that here the reference signal FS is also generated from the radio-frequency control signal HF itself. For this, the part of the radio-frequency control signal HF decoupled for the phase comparator 22 is also supplied to a rectifier, which rectifies the radio-frequency control signal HF and, on the output side, generates the desired guide signal FS for the comparator 11. The radio-frequency control signal HF to be fed in is particularly well suited as an amplitude nominal value, since it is a very precise signal that exactly exhibits the pulse shape necessary for the emission of the correct radio-frequency pulses.

Instead of a birdcage antenna another antenna shape can be used. Likewise, in a simple exemplary embodiment only a single probe can be used in order to generate a restorative signal, or a larger number of probes can be used. A combination of the various exemplary embodiments is also possible, for example a decoupling of the restorative signal with one or more directional couplers and a subsequent phase-sensitive regulation.

Although modifications and changes may be suggested by those skilled in the art, it is the intention of the inventors to embody within the patent warranted hereon all changes and modifications as reasonably and properly come within the scope of their contribution to the art.

We claim as our invention:

1. A method for correcting a field strength of radio-frequency pulses emitted by an antenna having a plurality of supply lines, in a magnetic resonance examination conducted in a magnetic resonance examination apparatus, comprising the steps of:

in a magnetic resonance examination, supplying power into an antenna to cause current to flow in the antenna to emit a radio-frequency pulse having a field strength; and regulating said current in said antenna, and thereby regulating the field strength of the radio-frequency pulse, by changing said power by connecting respective directional couplers in said two supply lines; using said directional couplers, determining a restorative signal for regulating said current in said antenna, and using said restorative signal to regulate said current in said antenna by changing said power.

2. A method as claimed in claim 1 comprising maintaining said current constant during said magnetic resonance examination.

3. A method as claimed in claim 1 wherein said magnetic resonance examination is conducted on a subject having an influence on said field strength of said radio-frequency pulse, and comprising, during said magnetic resonance examination, regulating said current in said antenna, by changing said power, to compensate for said influence of the subject on the field strength of the radio-frequency pulse.

4. A method as claimed in claim 1 comprising making a basic adjustment of said power before beginning said magnetic resonance examination.

5. A method as claimed in claim 1 comprising regulating said current in said antenna phase-sensitively.

6. A method as claimed in claim 1 comprising the steps of:

arranging a field probe within said field of said antenna;

using said field probe, obtaining a restorative signal; and employing said restorative signal to change said power to regulate said current.

7. A method as claimed in claim 6 comprising employing two field probes disposed at an angle relative to each other in said field of said antenna;

obtaining respective output signals from said two field probes; and forming said restorative signal by a phase-shifted superimposition of the respective output signals of said two field probes.

8. A method as claimed in claim 7 comprising conducting said magnetic resonance examination on a subject, and selecting said angle from the group of angles, relative to a horizontal slice plane through said subject, consisting of 0°, 90°, 180° and 270°.

9. In a magnetic resonance examination apparatus for conducting a magnetic resonance examination of a subject, the improvement comprising:

a power supply arrangement;

a radio-frequency antenna supplied with power by said power supply arrangement to cause current to flow in said antenna to cause a radio-frequency pulse, having a field strength associated therewith, to be emitted from said antenna;

a regulation device connected to said power supply for regulating said current, and thereby regulating said field strength by changing said power by a predetermined nominal value; and a field probe disposed in said field, said field probe emitting an output signal, said field probe being connected to said regulation device and said regulation device regulating said current dependent on said output signal from said field probe, said field probe comprising two field probe elements that respectively emit linearly polarized components, and said regulation device determining a circularly polarized field emitted by said antenna from said linearly polarized components.

10. A magnetic resonance examination apparatus as claimed in claim 9 further comprising a phase shifter connected between said two field probe elements and said regulation device, said phase shifter superimposing respective output signals from said two field probe elements to form a common restorative signal.

11. A magnetic resonance examination apparatus as claimed in claim 9 wherein said two field probe elements are disposed at an angle, relative to a horizontal slice plane through the subject, selected from the group of angles consisting of 0°, 90°, 180° and 270°.

12. A magnetic resonance examination apparatus as claimed in claim 9 wherein said antenna encompasses a volume, and wherein said field probe is disposed outside of said volume.

13. A magnetic resonance examination apparatus as claimed in claim 9 wherein said power supply arrangement comprises supply lines connected to said antenna, and further comprising respective directional couplers connected in said supply lines, and connected to said regulation device for use by said regulation device in regulating said current.

* * * * *